(12) United States Patent
Berkhout et al.

(10) Patent No.: US 10,498,297 B2
(45) Date of Patent: Dec. 3, 2019

(54) AMPLIFIER CIRCUIT

(71) Applicant: NXP B.V., Eindhoven (NL)

(72) Inventors: Marco Berkhout, Tiel (NL); Jokin Segundo Babarro, Arnhem (NL); Paulus Petrus Franciscus Maria Bruin, Nijmegen (NL)

(73) Assignee: NXP B. V., Eindhoven (NL)

( * ) Notice: Subject to any disclaimer, the term of this patent is extended or adjusted under 35 U.S.C. 154(b) by 51 days.

(21) Appl. No.: 16/002,545

(22) Filed: Jun. 7, 2018

(65) Prior Publication Data
US 2019/0007009 A1 Jan. 3, 2019

(30) Foreign Application Priority Data
Jun. 30, 2017 (EP) .................................... 17179110

(51) Int. Cl.
*H03F 3/21* (2006.01)
*H03F 3/217* (2006.01)
(Continued)

(52) U.S. Cl.
CPC ........... *H03F 3/2173* (2013.01); *H03L 7/093* (2013.01); *H03M 3/32* (2013.01); *H03M 3/406* (2013.01); *H03F 2200/351* (2013.01)

(58) Field of Classification Search
CPC .................................................... H03F 3/2173
See application file for complete search history.

(56) References Cited

U.S. PATENT DOCUMENTS 6,163,287 A * 12/2000 Huang ................. H03M 3/344
327/558
8,736,473 B2 5/2014 Dijkmans
(Continued)

FOREIGN PATENT DOCUMENTS

WO WO 2006/124491 A2 11/2006
WO WO 2012/100105 A1 7/2012

OTHER PUBLICATIONS

Berkhout, Marco et al; "A 4Ω 2.65W Class-D Audio Amplifier with Embedded DC-DC Boost Converter, Current Sensing ADC and DSP for Adaptive Speaker Protection"; IEEE Journal of Solid-State Circuits, vol. 48, No. 12; pp. 2952-2961 (Dec. 2013).
(Continued)

*Primary Examiner* — Patricia T Nguyen

(57) ABSTRACT

A loop-filter comprising: a first-integrator, and one or more further-integrators. The first-integrator is an active-RC integrator, and comprises a first-integrator-input-terminal configured to receive: (i) an input-signal, and (ii) a feedback-signal; a first-integrator-first-output-terminal configured to provide a first-integrator-first-output-signal; and one or more first-integrator-further-output-terminals. Each of the one or more further-integrators is a Gm-C integrator, and they are connected in series between the first-integrator-first-output-terminal and a loop-filter-output-terminal. For a first further-integrator in the series, the further-integrator-input-terminal is configured to receive the first-integrator-first-output-signal. For any subsequent further-integrators in the series, the further-integrator-input-terminal is configured to receive: (i) the further-integrator-output-signal from the preceding further-integrator in the series; and (ii) one of the first-integrator-further-output-signals.

15 Claims, 11 Drawing Sheets

(51) Int. Cl.
*H03L 7/093* (2006.01)
*H03M 3/00* (2006.01)

(56) References Cited

U.S. PATENT DOCUMENTS

| | | | | |
|---|---|---|---|---|
| 2001/0009403 | A1* | 7/2001 | Huang | H03H 11/04 |
| | | | | 341/143 |
| 2005/0083115 | A1 | 4/2005 | Risbo | |
| 2005/0232101 | A1* | 10/2005 | Hasegawa | H03H 11/1291 |
| | | | | 369/47.1 |
| 2006/0103560 | A1 | 5/2006 | Nagai | |
| 2008/0062022 | A1 | 3/2008 | Melanson | |
| 2010/0123518 | A1 | 5/2010 | Hou et al. | |
| 2013/0021184 | A1* | 1/2013 | Ashburn, Jr. | H03M 3/374 |
| | | | | 341/143 |
| 2014/0285368 | A1* | 9/2014 | Anderson | H03M 3/464 |
| | | | | 341/143 |
| 2016/0036460 | A1* | 2/2016 | Mattisson | H03M 3/344 |
| | | | | 341/110 |

OTHER PUBLICATIONS

Bolatkale, Muhammed et al; "A 4 GHz CT ΩΣ ADC with 70dB DR and -74dFS THD in 125MHz BW"; ISSCC Dig. Tech Papers; pp. 470-471 (Feb. 2011).

Drooper, Lutzen et al; "A 3.4 W Digital-in Class D Audio Amplifier in 0.14m CMOS"; IEEE Journal of Solid-State Circuits, vol. 47, No. 7; pp. 1524-1534 (Jul. 2012).

Hoyerby, Mikkel et al; "A 2×70 W Monolithic Five-Level Class-D Power Amplifier in 180nm BCD"; IEEE Journal of Solid-State Circuits, vol. 51, No. 12; pp. 2819-2829 (Dec. 2016).

Park, Chang-Joon et al; "Efficient Broadband Current-Mode Adder Quantizer Design for Continuous-Time Sigma-Delta Modulators"; IEEE Transactions on Very Large Scale Integration Systems, vol. 23, No. 9; pp. 1920-1930 (Sep. 2015).

\* cited by examiner

AMPLIFIER CIRCUIT

CROSS-REFERENCE TO RELATED APPLICATIONS

This application claims the priority under 35 U.S.C. § 119 of European patent application no. 17179110.6, filed Jun. 30, 2018 the contents of which are incorporated by reference herein.

The present disclosure relates to amplifier circuits, and in particular, although not exclusively, to class-D amplifier circuits that have a $2^{nd}$ order, or higher, loop transfer function.

According to a first aspect of the present disclosure there is provided a circuit comprising:
 a loop-filter comprising:
  a loop-filter-output-terminal configured to provide a loop-filter-output-signal;
  a first-integrator, wherein the first-integrator is an active-RC integrator, the first-integrator comprising:
   a first-integrator-input-terminal configured to receive: (i) an input-signal, and (ii) a feedback-signal;
   a first-integrator-first-output-terminal configured to provide a first-integrator-first-output-signal, which is proportional to an integral of the signals received at the first-integrator-input-terminal; and
   one or more first-integrator-further-output-terminals, which are each configured to provide a first-integrator-further-output-signal that is proportional to an integral of the signals received at the first-integrator-input-terminal;
  one or more further-integrators, wherein:
   each of the one or more further-integrators is a Gm-C integrator,
   the one or more further-integrators are connected in series between the first-integrator-first-output-terminal and the loop-filter-output-terminal,
   each of the further-integrators comprises a further-integrator-output-terminal and a further-integrator-input-terminal:
   each further-integrator-output-terminal is configured to provide a further-integrator-output-signal that is proportional to an integral of the signals received at its further-integrator-input-terminal;
   for a first further-integrator in the series, the further-integrator-input-terminal is configured to receive the first-integrator-first-output-signal; and
   for any subsequent further-integrators in the series, the further-integrator-input-terminal is configured to receive: (i) the further-integrator-output-signal from the preceding further-integrator in the series; and (ii) one of the first-integrator-further-output-signals.

Using an active-RC integrator as the first-integrator in the series can enable accurate summation of the input-signal and the feedback-signal. Also, using Gm-C integrators as subsequent integrators in the series, can provide for efficient summation with feedforward currents.

In one or more embodiments, the first-integrator comprises a quasi-differential architecture.

In one or more embodiments, the circuit further comprises one or more of:
 a circuit-input-terminal configured to receive the input-signal;
 a circuit-output-terminal configured to provide an output-signal, wherein the feedback-signal is representative of the output-signal; and
 a modulator configured to provide the output-signal based on the loop-filter-output-signal.

In one or more embodiments, the first-integrator of the loop-filter comprises:
 a first-integrator-positive-input-terminal configured to receive a positive-input-signal;
 a first-integrator-negative-input-terminal configured to receive a negative-input-signal;
 a first-integrator-common-mode-input-terminal configured to receive a common-mode-input-signal;
 a first-integrator-positive-first-output-terminal configured to provide a first-integrator-positive-first-output-signal;
 one or more first-integrator-positive-further-output-terminals, each configured to provide a first-integrator-positive-further-output-signal;
 a first-integrator-negative-first-output-terminal configured to provide a first-integrator-negative-first-output-signal;
 one or more first-integrator-negative-further-output-terminals, each configured to provide a first-integrator-negative-further-output-signal;
 a first-integrator-transconductance-amplifier;
 a second-integrator-transconductance-amplifier;
 an input-adder;
 a first-output-adder;
 a second-output-adder;
 one or more positive-further-output-signal-generators; and
 one or more negative-further-output-signal-generators.

The first-integrator-transconductance-amplifier may be configured to receive the positive-input-signal and the negative-input-signal, and provide: (i) an output signal to the first-output adder, and (ii) an output signal to the second-output adder. The input-adder may be configured to sum the positive-input-signal and the negative-input-signal, and provide a summed-input-signal. The second-integrator-transconductance-amplifier may be configured to receive the summed-input-signal and the common-mode-input-signal, and provide: (i) an output signal to the first-output adder, and (ii) an output signal to the second-output adder. The first-output-adder may be configured to provide the first-integrator-negative-first-output-signal to the first-integrator-negative-first-output-terminal. The second-output-adder may be configured to provide the first-integrator-positive-first-output-signal to the first-integrator-positive-first-output-terminal.

The one or more positive-further-output-signal-generators may be configured to:
 generate the one or more first-integrator-positive-further-output-signals based on the first-integrator-positive-first-output-signal; and
 provide the one or more first-integrator-positive-further-output-signals to the one or more first-integrator-positive-further-output-terminals.

The one or more negative-further-output-signal-generators may be configured to:
 generate the one or more first-integrator-negative-further-output-signals based on the first-integrator-negative-first-output-signal; and
 provide the one or more first-integrator-negative-further-output-signals to the one or more first-integrator-negative-further-output-terminals.

In one or more embodiments, the transconductance of the first-integrator-transconductance-amplifier is unequal to the transconductance of the second-integrator-transconductance-amplifier.

In one or more embodiments, the first-integrator of the loop-filter further comprises an attenuator configured to provide an attenuated-summed-input-signal. The second-integrator-transconductance-amplifier may be configured to receive the attenuated-summed-input-signal and the common-mode-input-signal.

In one or more embodiments, the loop-filter comprises two or more further-integrators.

In one or more embodiments, one of the first-integrator-further-output-terminals is connected to the loop-filter-output-terminal in order to provide a first-integrator-further-output-signal to the loop-filter-output-terminal.

In one or more embodiments, one or more of the first-integrator-further-output-signals represents a scaled-down version of the first-integrator-first-output-signal.

In one or more embodiments, the first integrator comprises a current mirror configured to provide the one or more first-integrator-further-output-signals.

In one or more embodiments, the circuit comprises an audio-amplifier-circuit.

In one or more embodiments, the modulator comprises a PWM-modulator configured to provide the output-signal based on a comparison between the loop-filter-output-signal and a reference-signal.

In one or more embodiments, the circuit comprises a sigma-delta-modulator-circuit. The modulator may comprise a quantizer configured to provide the output-signal by quantizing the loop-filter-output-signal.

There is also provided a bridge-tied-load circuit comprising a positive-audio-amplifier-circuit that includes any circuit disclosed herein. The circuit-input-terminal may be a positive-circuit-input-terminal that is configured to receive a positive-input-signal. The circuit-output-terminal may be a positive-circuit-output-terminal configured to provide a positive-PWM-output-signal.

The bridge-tied-load circuit may also comprise a negative-audio-amplifier-circuit that includes any circuit disclosed herein. The circuit-input-terminal may be a negative-circuit-input-terminal that is configured to receive a negative-input-signal. The circuit-output-terminal may be a negative-circuit-output-terminal configured to provide a negative-PWM-output-signal.

In one or more embodiments, the bridge-tied-load circuit further comprises a quasi-differential integrator configured to provide the functionality of the first-integrator of both the positive-audio-amplifier-circuit and the negative-audio-amplifier-circuit.

There may be provided a Class-D amplifier-circuit comprising any circuit disclosed herein.

There may be provided a smart speaker driver comprising any circuit disclosed herein.

There may be provided an integrated circuit comprising any circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

The acquisition and reproduction of audio signals was one of the first applications of electronic circuits. Today, audio electronics are ubiquitous and can be found in television and hi-fi stereo sets, car audio systems and more recently in mobile or cellular phones along with many other portable applications. A majority of these electronics is in the form of integrated circuits.

Figure 13:
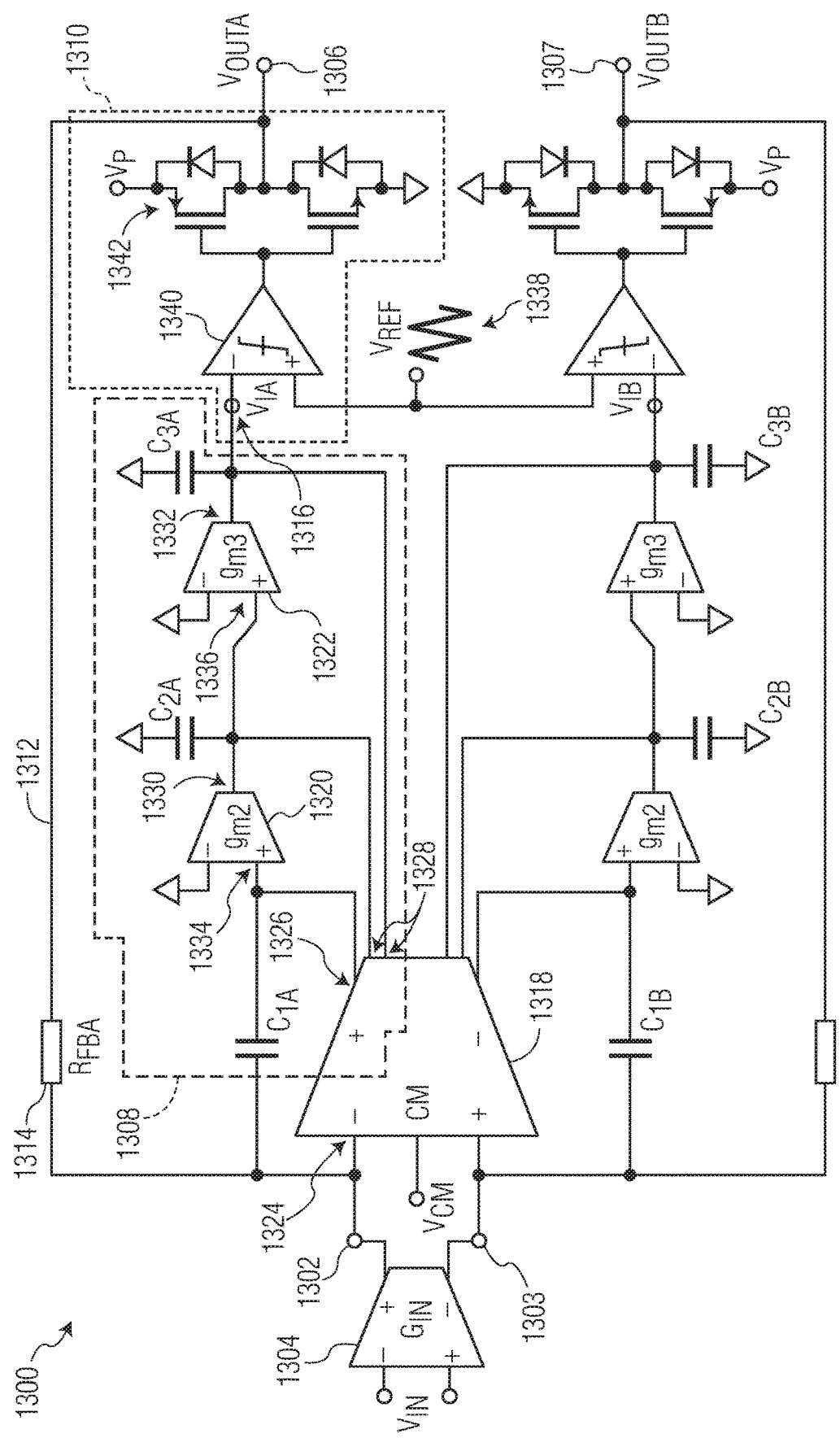
FIG. 13 shows an example embodiment of an amplifier-circuit that comprises a class-D amplifier with a quasi-differential 3rd order loop filter.

One or more examples disclosed herein relate to a loop-filter that has a series of integrators, wherein a first-integrator is an active-RC integrator and one or more further-integrators are Gm-C integrators. Such an example is shown in FIG. 13, and can be particularly well suited for amplifiers (such as class-D amplifiers/audio amplifiers) and sigma-delta converters because it can have a good noise profile for relatively low power/area overheads. Optionally, the first-integrator can be provided as a quasi-differential implementation, as shown in FIG. 11B, which can advantageously achieve low levels of differential-mode equivalent input noise.

The majority of the following description relates to audio amplifier circuits. However, it will be appreciated, especially from the description of FIG. 15, that one or more of the loop filters that are described with reference to an audio amplifier application can also be used in a sigma-delta converter, including a continuous time sigma-delta converter.

Figure 1:
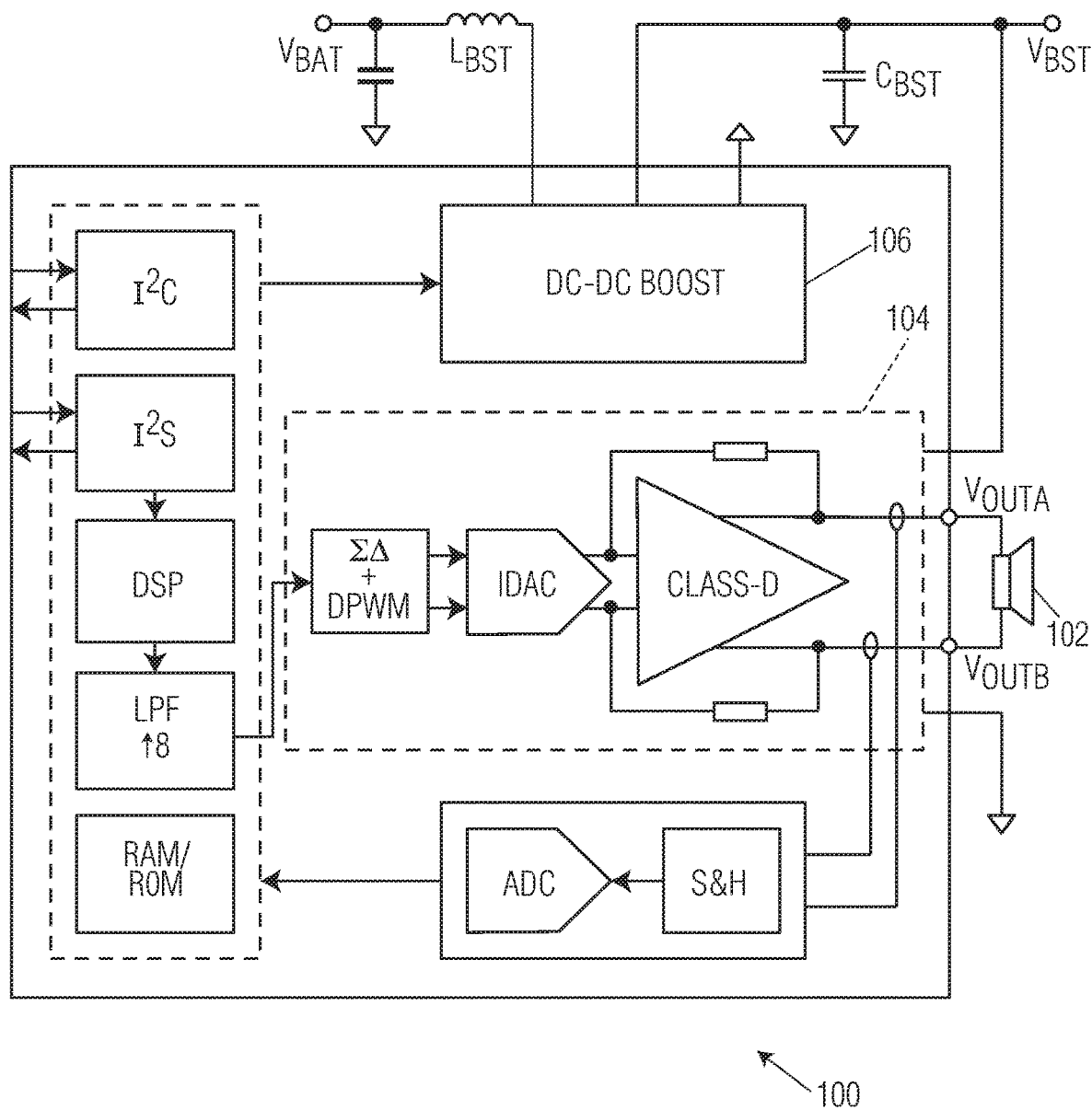
FIG. 1 illustrates a block diagram of a smart speaker driver for use in mobile phones.

FIG. 1 illustrates a block diagram of a smart speaker driver 100 for use in mobile phones. A smart speaker driver 100 can maximize acoustic output while ensuring that a loud-speaker 102 is not damaged. This may be achieved by predicting a membrane excursion and estimating a voice-coil temperature by means of a speaker model. The membrane excursion is directly related to the sound pressure level (SPL). Differences between the speaker model and the real performance can be reduced by feedback of a real-time measurement of current entering the loud-speaker 102.

A component of the smart speaker driver 100 is a high efficiency class-D amplifier 104 that drives the loud-speaker 102. The class-D amplifier 104 is supplied by a DC-DC boost converter 106 in this example, which can provide high output power even at a low battery voltage. The DC-DC boost converter 106 is controlled from the digital domain and may only be enabled when high power is required at the output of the class-D amplifier 104. The combined efficiency of the DC-DC boost converter 106 and the class-D amplifier 104 can be optimized by performing a coarse envelope tracking of the audio signal.

In a class-D amplifier 104, two large power MOSFETs (not shown) in an output stage can connect the output node VOUT to either ground or the supply. Pulse-Width Modulation (PWM) can be used to drive the output node VOUT, and the output signal can be recovered with a lossless LC-low-pass filter between the class-D output stage and the loudspeaker load 102.

Figure 2:
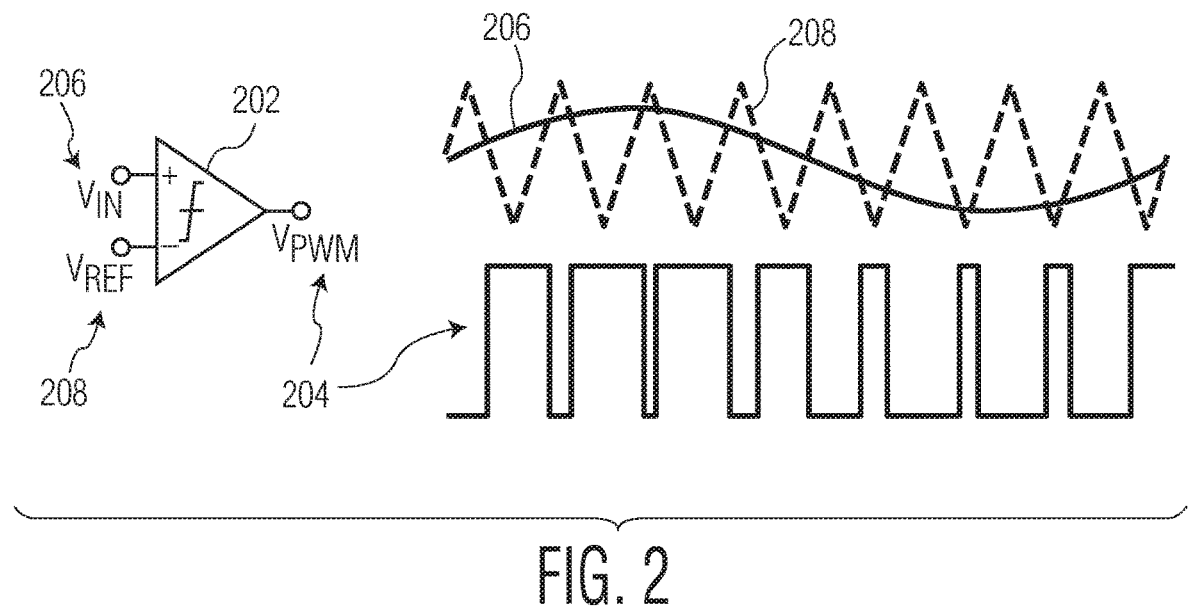
FIG. 2 shows graphically an example of how a comparator can be used to generate a PWM signal.

FIG. 2 shows graphically an example of how a comparator 202 can be used to generate a PWM signal 204. The comparator 202 compares a (low-frequency) input signal VIN 206 with a (high-frequency) triangular reference waveform VREF 208. As shown on the right-hand side of FIG. 2, the output signal of the comparator 202 is a PWM signal VPWM 204 that has a duty-cycle that is proportional to the value of the input signal VIN 206. The PWM signal VPWM 204 can then be used to drive a class-D output stage, as will be described below.

Figure 3:
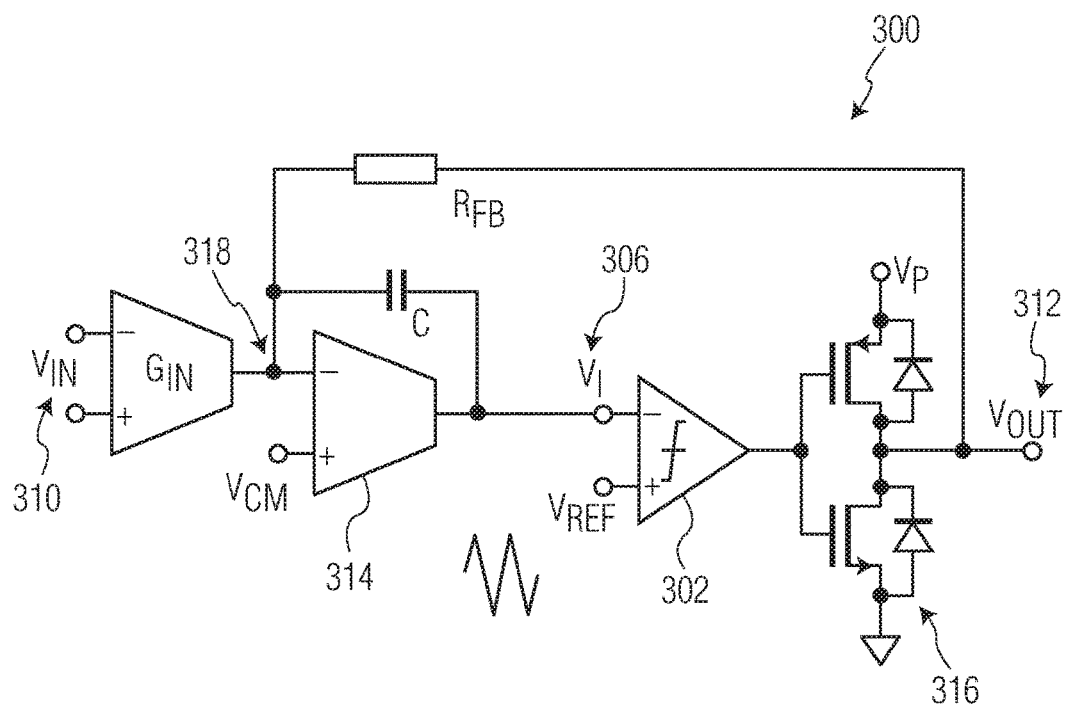
FIG. 3 shows a class-D amplifier with a 1st order PWM feedback loop.

FIG. 3 shows a class-D amplifier 300 with a 1st order PWM feedback loop. The class-D amplifier 300 includes an integrator 314, a comparator 302, and an output stage 316. The class-D amplifier 300 also has an amplifier-circuit-output-terminal, that provides a PWM-output-signal VOUT 312.

The comparator 302 compares an integrator-output-signal $V_I$ 306 with a triangular reference waveform VREF 308. In this example, the integrator-output-signal $V_I$ 306 that is compared with the reference triangle VREF 308 is not the input signal $V_{IN}$ 310, but the difference between the input signal $V_{IN}$ 310 and the PWM-output-signal VOUT 312 that is fed through the integrator 314, thus creating a first order loop filter. In this way, (i) a signal that is representative of the input signal $V_{IN}$ 310, and (ii) a signal that is representative of the PWM-output-signal VOUT 312, are connected to the same input terminal of the integrator 314, thereby defining a virtual ground node 318. In this way, a PWM generator and the class-D output stage 316 can be incorporated in a feedback loop as shown in FIG. 3.

Figure 4:
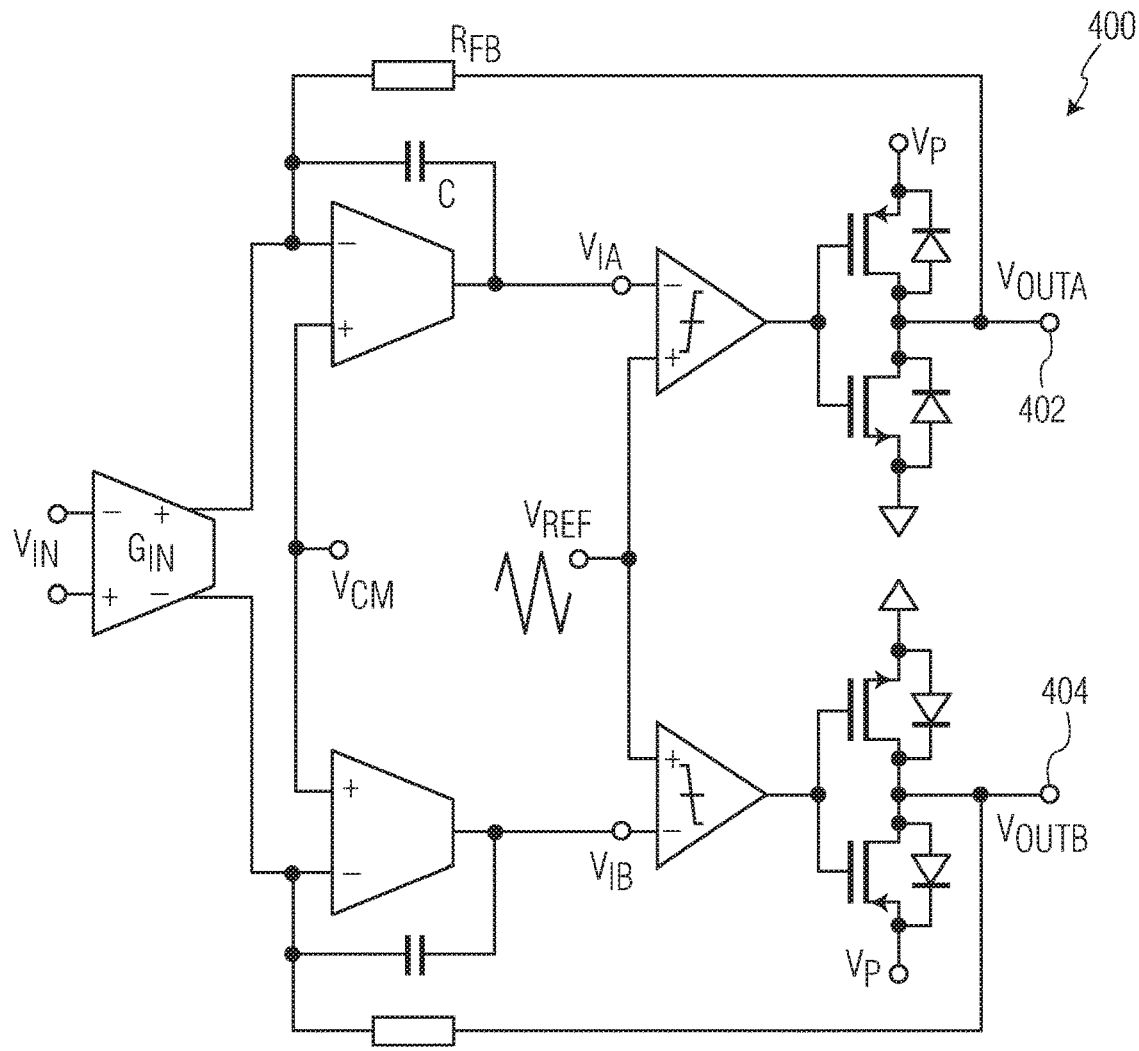
FIG. 4 shows a circuit that includes two class-D amplifiers in a pseudo-differential bridge-tied-load (BTL) configuration.

FIG. 4 shows a circuit 400 that includes two class-D amplifiers in a pseudo-differential bridge-tied-load (BTL) configuration. A first class-D amplifier circuit provides a first-PWM-output-signal VOUTA at a first-amplifier-circuit-output-terminal 402. A second class-D amplifier circuit provides a second-PWM-output-signal VOUTB at a second-amplifier-circuit-output-terminal 404.

In the BTL configuration the load (not shown) is connected between the first-amplifier-circuit-output-terminal 402 and the second-amplifier-circuit-output-terminal 404. This can double the voltage swing that is available to the load with the same supply voltage. Furthermore, the BTL configuration can allow for filter-less connection to a loud-speaker load (not shown). Such a filter-less BTL configuration can be particularly advantageous in mobile applications.

The circuit 400 of FIG. 4 can be considered as a pseudo-differential configuration because it includes two single-ended parts, which in some examples can be beneficial over a fully-differential configuration. This can be because the common-mode level of the signals at the amplifier-circuit-output-terminals 402, 404 can be well controlled.

Figure 5:
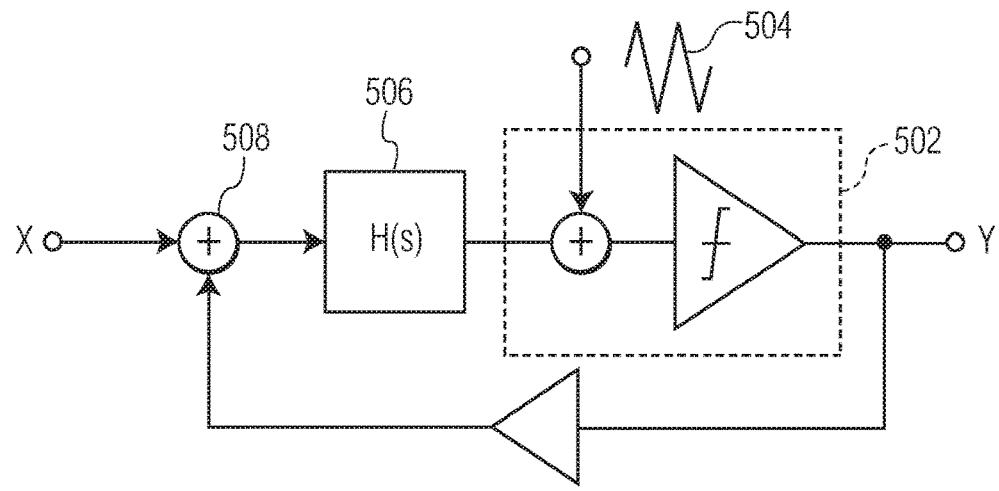
FIG. 5 shows a high-level block diagram of a class-D amplifier.

FIG. 5 shows a high-level block diagram of a class-D amplifier, which receives an input-signal X. The final stage of the class-D amplifier is a PWM-modulator 502 that provides an analogue PWM-output-signal Y. In the class-D amplifier of FIG. 5, all signals remain in the analogue domain.

The class-D amplifier includes a loop-filter 506, which applies a transfer function H(s) to a combination of the input-signal X and the PWM-output-signal Y in order to set the loop gain of the amplifier.

In the PWM-modulator 502, the output signal from the loop filter 506 and a triangular reference signal 504 are added together, and the result of the summation is quantized to either a low or a high value (based on whether the result of the summation is greater than, or less than, zero) in order to generate the PWM-output-signal Y. The PWM-output-signal Y is fed back to an input-summation block 508, which adds the PWM-output-signal Y to the input-signal X in order to provide the input signalling to the loop-filter 506.

One method to increase the loop gain of the class-D amplifier is to increase the order of the transfer function H(s) that is applied by the loop filter 506. One way of implementing a stable, higher order loop filter is by using a Cascade of Integrators with Feedforward summation (CIFF) in the class-D amplifier.

Figure 6:
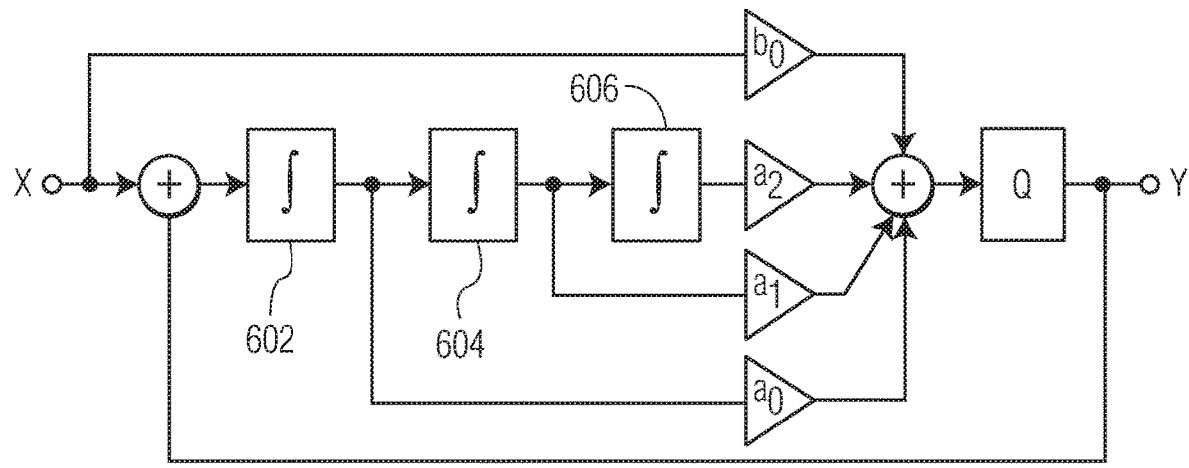
FIG. 6 shows a 3rd order Cascade of Integrators with Feedforward summation (CIFF) modulator.

FIG. 6 shows a $3^{rd}$ order Cascade of Integrators with Feedforward summation (CIFF) modulator. The CIFF modulator includes 3 integrators 602, 604, 606 in series, and therefore is a third order modulator. The feedforward paths a0 and a1 create zeros in the open loop transfer function, and realize a 1st order slope at the unity gain frequency. The direct input feedforward path b0 is optional and does not influence stability.

Figure 7A:
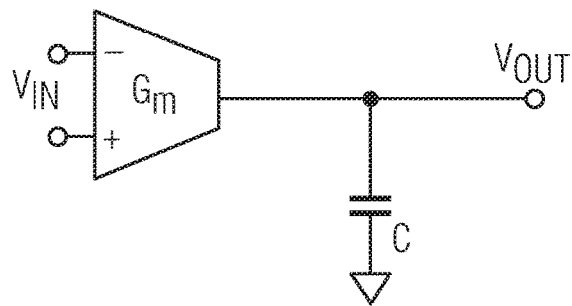
FIGS. 7A and 7B show two topologies for implementing an electronic integrator.
Figure 7B:
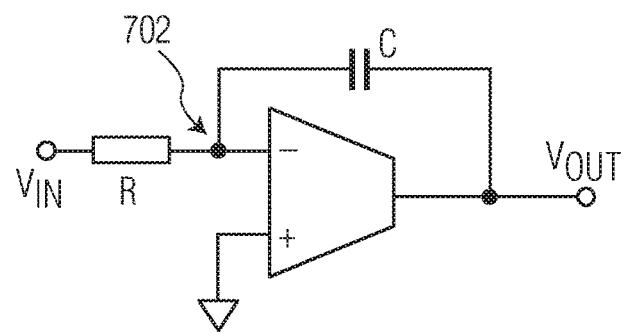

FIGS. 7A and 7B two topologies for implementing an electronic integrator: a Gm-C integrator is shown in FIG. 7A, and an active-RC integrator is shown in FIG. 7B.

Gm-C integrators can have high input impedance and can be capable of very high unity-gain frequencies due to their open loop nature.

Active-RC integrators can handle large input signal swings with high linearity due to the existence of a virtual ground node 702 at the input, as indicated above with reference to FIG. 3.

As will be discussed below with reference to FIG. 13, one or more of the amplifier circuits disclosed herein can use a combination of Gm-C integrators and active-RC integrators in series. An active-RC integrator can be used as the first-integrator in the series, and advantageously the virtual ground node 702 of the active-RC integrator can enable accurate summation of input/feedback signals. Also, Gm-C integrators can be used as subsequent integrators in the series, which can provide for efficient summation with feedforward currents.

Figure 8:
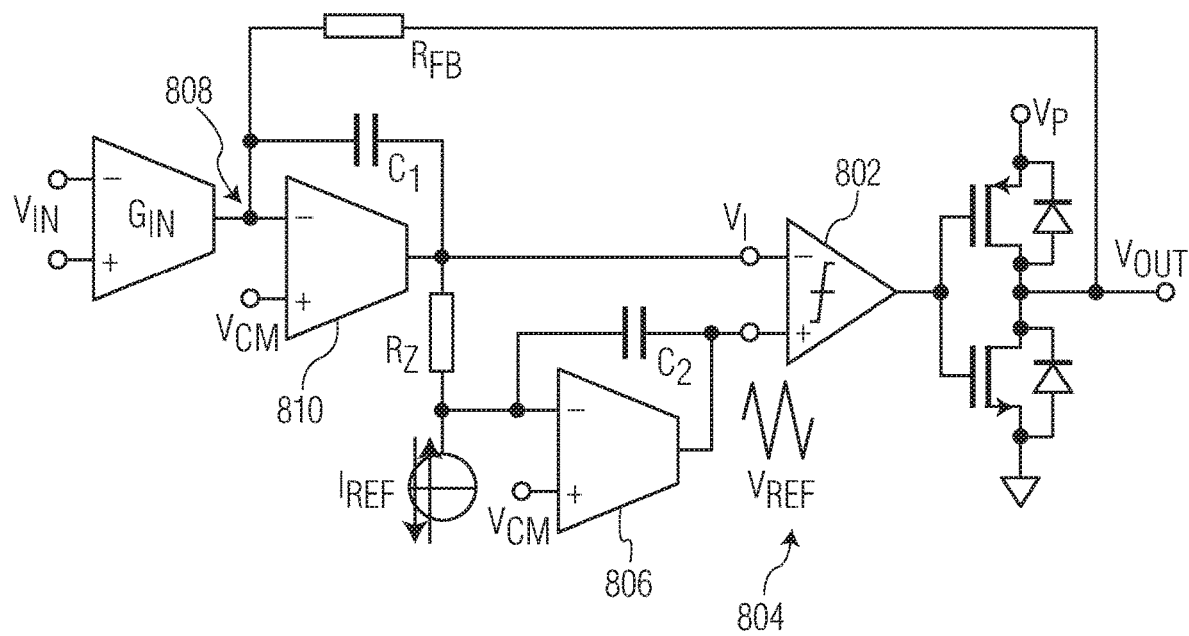
FIG. 8 shows a class-D amplifier with a 2nd order PWM feedback loop.

FIG. 8 shows a class-D amplifier with a $2^{nd}$ order PWM feedback loop. A $2^{nd}$ order feedback loop can provide sufficient loop gain to meet the high linearity requirements of audio amplifiers. The loop filter implementation uses two active-RC integrators and therefore is relatively power hungry.

The configuration shown in FIG. 8 can be considered as a topological variation of the CIFF architecture shown in FIG. 6. The differential input of the comparator 802 can serve as a 'free' summation point for the 1st order and 2nd order paths. Furthermore, the addition of the triangular reference VREF 804 is realized by adding a square-wave before the second integrator 806. It has been found that this configuration of active-RC integrators is not convenient for extension to higher orders because there is no 'free' summation point for a third (or subsequent) integrator output.

FIGS. 9A, 9B, 9C and 9D show various implementations of circuits that can perform a summing operation, such as a summing operation that may be required at the outputs of integrators in a $2^{nd}$ (or higher) order PWM feedback loop. The summation circuits can use voltage-mode techniques using resistive or capacitive networks or current-mode techniques using transconductors.

Figure 9A:
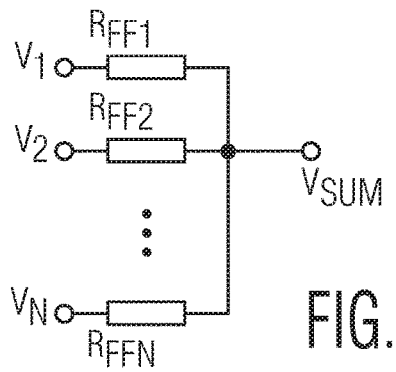
FIGS. 9A, 9B, 9C and 9D show various implementations of circuits that can perform a summing operation.

FIG. 9A shows a very simple voltage-mode technique that uses a passive resistor network. A drawback of this technique is that the output is attenuated by the resistive division and the (capacitive) load of the network introduces a parasitic pole. This pole can be shifted to higher frequencies by reducing the values of the feedforward resistors RFF(N) but this increases the loading of the integrators.

Figure 9B:
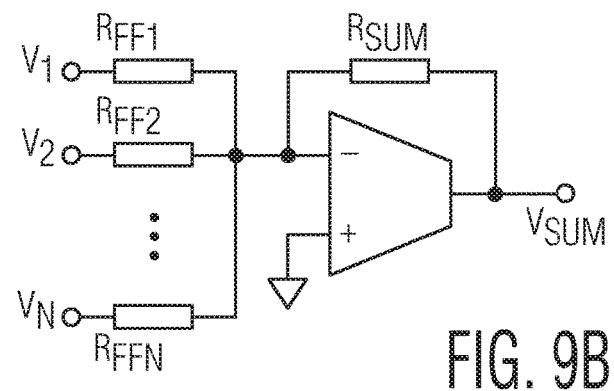

FIG. 9B shows a circuit that includes an active resistive summing amplifier. In this case, the gain of the summing operation can be chosen freely by feedback resistor RSUM, and the high value feedforward resistors RFF(N) can be used to reduce integrator loading.

Figure 9C:
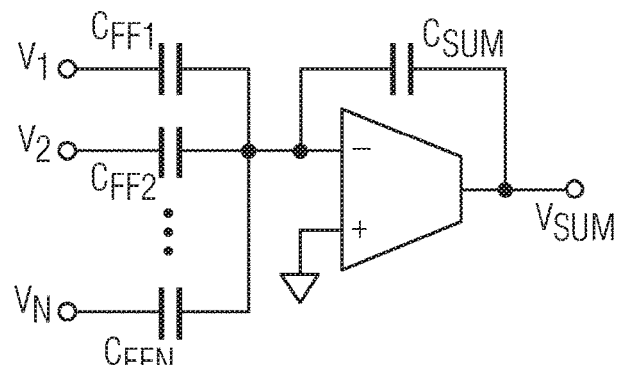

FIG. 9C shows a circuit that includes an active capacitive summing amplifier, wherein the feedforward and summing resistors of FIG. 9B are replaced by capacitors CFF(N). In this case, the summing amplifier can be elegantly combined with the last integrator stage so no additional summing amplifier is required.

Figure 9D:
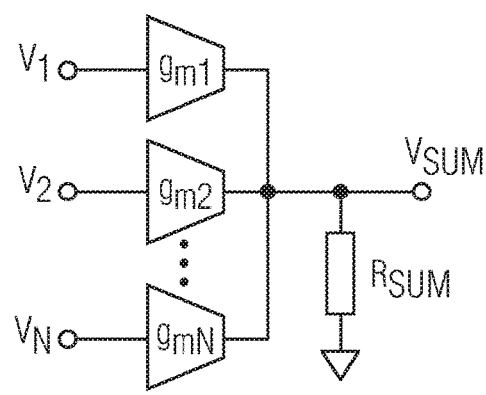

FIG. 9D shows an implementation where the feedforward signals are converted to currents with transconductors gm(N) and subsequently added on a summing resistor RSUM. This implementation may not suffer the bandwidth limitation of feedback amplifiers. Since the transconductor stages have a high input impedance, this implementation can be especially suitable in CIFF structures with gm-C integrators instead of active-RC integrators. Therefore, the example embodiment of FIG. 13 uses the implementation of FIG. 9D to perform summation of the feedforward currents, as will be discussed below.

A problem that has been found with using a higher-order CIFF structure in a class-D amplifier is power consumption, and in particular: 1. power consumption of a feedforward summing operation, 2. power consumption if a first pseudo-differential integrator stage is used. One or more of the amplifier-circuits described below can provide reduced power consumption.

As indicated above, a pseudo-differential architecture can provide advantages over a fully-differential architecture in class-D amplifiers, because better control of the common-mode level of the output can be achieved. Furthermore, a fully-differential active-RC integrator may only provide a virtual ground node for differential mode signals; no virtual ground node may be available for common-mode signals. A filter-less (BD-modulated) class-D amplifier as shown in FIG. 4 can have a substantial common-mode component at the output. Consequently, in a fully-differential architecture, the virtual ground nodes at the input of the first integrator follow the common-mode swing at the output of the class-D amplifier. A pseudo-differential architecture works for both differential-mode and common-mode signals. However, a penalty comes with the fact that two input stages are needed and the noise (and offset) of these two input stages add up. For a given noise (offset) requirement, the noise (offset) contribution of each single-ended input stage should be $\sqrt{2}$ lower. In general, this means that each single-ended input stage consumes twice the power (area) that would be required for a fully-differential input stage with the same specification. Since two single-ended input stages are used instead of one fully-differential, the actual penalty in terms of power and area is a factor of 4.

As will be discussed in detail below, a modified version of the CIFF structure can provide an advantageous mechanism for feedforward summation. As indicated above, a purpose of the feedforward paths in the CIFF structure is to create zeros in the loop transfer. They can improve the stability of the closed loop, but do not necessarily have to be very accurate. Accuracy of the closed loop transfer can be provided by the high gain of the cascade of integrators. Furthermore, the summation operation does not necessarily need to be done at the end of the cascade of integrators as it is shown in FIG. 6.

Figure 10A:
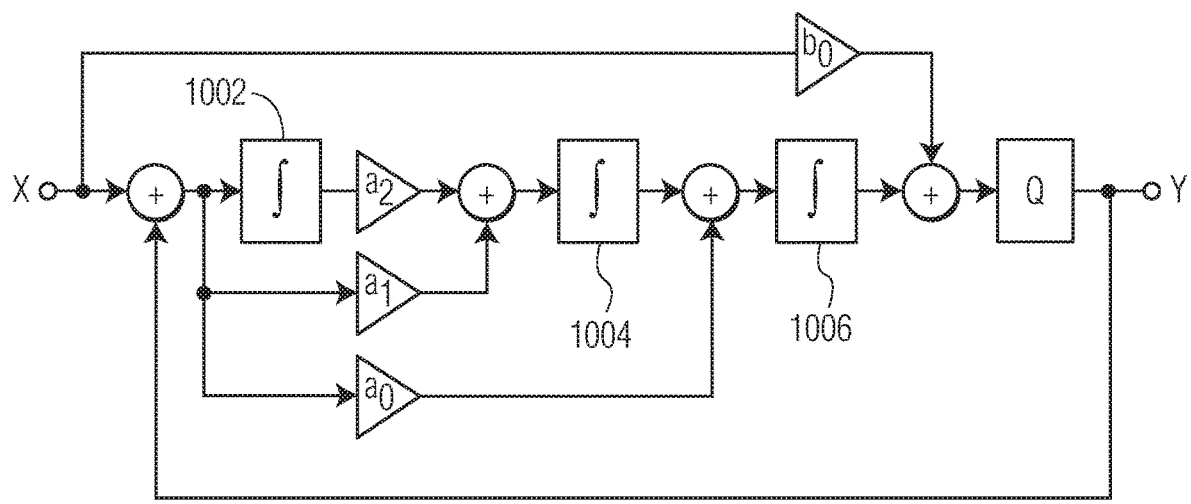
FIGS. 10A and 10B show alternative circuits that have the same loop transfer function as the CIFF structure shown in FIG. 6.
Figure 10B:
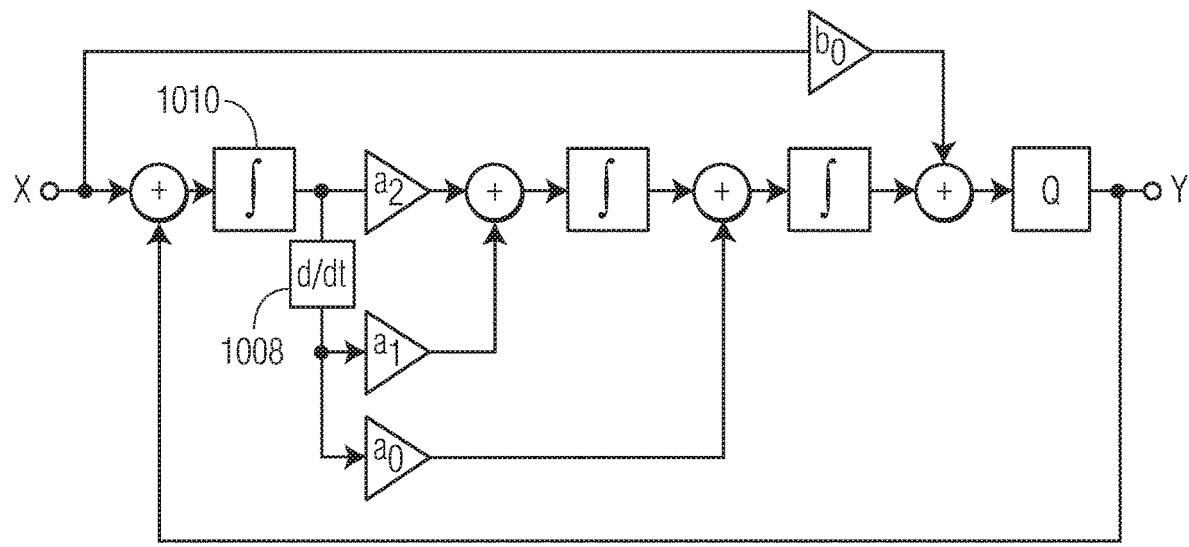

FIGS. 10a and 10b show alternative circuits that have the same loop transfer function as the CIFF structure shown in FIG. 6. FIG. 10A shows a CIFF equivalent structure with distributed summation. FIG. 10B shows a CIFF equivalent structure with distributed summation and integrator input replication.

In the structure of FIG. 10A, the input signal of the first integrator 1002 is fed forward to the inputs of the other integrators 1004, 1006. This integrator input signal is the summation of input signal X and output signal Y, and can be referred to as an error signal. If the first integrator is an active-RC type, the error signal is a current created by summing the feedback current and the input current at the virtual ground node. In this case, the error signal is not immediately available for the feedforward paths. Instead a replica of the error signal can be made by differentiating 1008 the output of the first integrator, as shown in FIG. 10B. The structure of FIG. 10B has been found to be a good match for a cascade of integrators where the first integrator is an active-RC type and the following integrators are gm-C type. This will be explained in detail below with reference to FIG. 13.

Figure 11A:
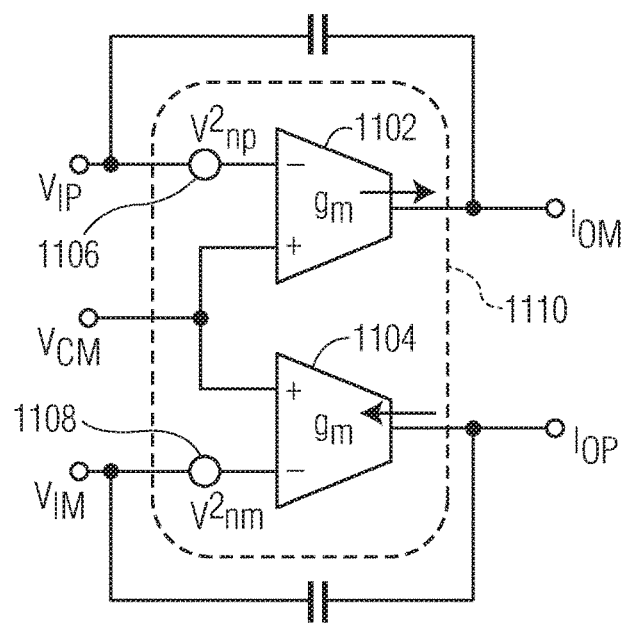
FIG. 11A shows a pseudo-differential configuration of two integrators.
Figure 11B:
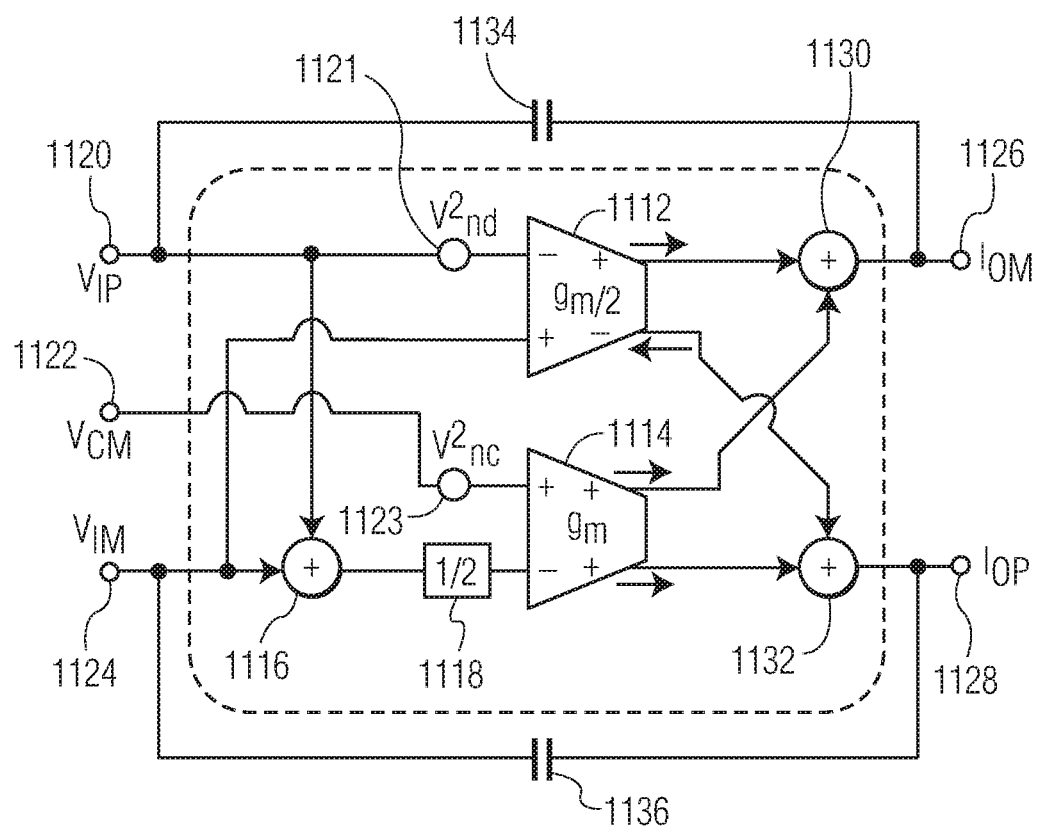
FIG. 11B shows a quasi-differential implementation of the (pseudo-differential) integrators of FIG. 11A.

FIG. 11A shows a pseudo-differential configuration of two integrators. Each of the integrators are single-ended active-RC integrators with capacitive feedback around a differential-in single-ended out transconductor gm 1102, 1104.

Both transconductors 1102, 1104 have an individual uncorrelated equivalent input noise source $v^2_{np}$ 1106 and $v^2_{nm}$ 1108 with a magnitude that is inversely proportional to the transconductance $g_m$. For a BTL class-D amplifier, only the differential mode noise is relevant. The common-mode component of the noise should not appear across the loudspeaker and therefore should not be audible. The differential-mode equivalent input noise voltage $v^2_{n,DM}$ of the pseudo-differential configuration is the uncorrelated sum of the individual input noise sources:

$$v_{n,DM}^2 = v_{np}^2 + v_{nm}^2$$

The same holds for the common-mode equivalent input noise voltage $v^2_{n,CM}$:

$$v_{n,CM}^2 = v_{np}^2 + v_{nm}^2$$

The differential-mode equivalent input noise can be reduced by increasing the transconductance $g_m$, which may require more power and/or area. At the same time, this can also reduce the common-mode equivalent input noise. However, reducing the common-mode equivalent input noise can provide little or no practical benefit because the common-mode noise should not be audible when a loudspeaker load is used.

The combination of the two single-ended transconductors can be considered as a single integrator-element 1110 with three input voltages and two output currents, as indicated with the dashed box in FIG. 11A. The three input signals are: VIP (input voltage (plus)), VIM (input voltage (minus)), and VCM (common mode voltage). The two output signals are: IOM (output current (minus)), and IOP (output current (plus)).

FIG. 11B shows a quasi-differential implementation of the (pseudo-differential) integrators of FIG. 11A. In FIG. 11B, a separate path for differential mode signals and common-mode signals is provided. In this quasi-differential configuration, the upper transconductor 1112 is fully-differential whereas the lower transconductor 1114 has two identical, common-mode outputs. The division by two in both the upper transconductor 1112 and after an input-adder 1116 (as shown by halving-block 1118 in FIG. 11A) can enable the transfer function of FIG. 11B to be the same as that of FIG. 11A. However, advantageously the equivalent input noise $v^2_{nd}$ 1121 of the fully-differential (upper) transconductor 1112 is now the only contributor to: (i) the differential-mode equivalent input noise; and (ii) the equivalent input noise $v^2_{nc}$ 1123 of the common-mode (lower) transconductor 1114. Consequently, the equivalent differential input noise can be reduced separately from the equivalent common-mode input noise by increasing only the $g_m$ of the fully-differential path.

In the quasi-differential implementation of FIG. 11B, the equivalent differential-mode input noise is actually the same as in the pseudo-differential implementation of FIG. 11A, although it requires a lower power/area because the upper fully-differential transconductor 1112 has half the $g_m$ of the upper transconductor 1102 in FIG. 11A. If the transconductor 1112 of the fully-differential path in FIG. 11B is scaled up to the same $g_m$ as the upper transconductor 1102 in FIG. 11A, then the equivalent differential-mode input noise power will be two times lower for the same power/area consumption. Furthermore, the power/area consumption of FIG. 11B can be reduced by reducing the $g_m$ of the common-mode transconductor 1114 without affecting the equivalent differential-mode noise.

In more detail, FIG. 11B shows an integrator, which as will be discussed below, can be implemented as a first-integrator in a loop-filter. The integrator includes:
    a first-integrator-positive-input-terminal 1120 configured to receive a positive-input-signal VIP;
    a first-integrator-negative-input-terminal 1124 configured to receive a negative-input-signal VIM;
    a first-integrator-common-mode-input-terminal 1122 configured to receive a common-mode-input-signal VCM;
    a first-integrator-positive-first-output-terminal 1128 configured to provide a first-integrator-positive-first-output-signal IOP; and
    a first-integrator-negative-first-output-terminal 1126 configured to provide a first-integrator-negative-first-output-signal IOM.

The integrator includes:
    a first-integrator-transconductance-amplifier 1112;
    a second-integrator-transconductance-amplifier 1114;
    an input-adder 1116;
    a first-output-adder 1130; and
    a second-output-adder 1132;

The first-integrator-transconductance-amplifier 1112 is configured to receive the positive-input-signal VIP and the negative-input-signal VIM, and provide: (i) an output signal to the first-output adder 1130, and (ii) an output signal to the second-output adder 1132.

The input-adder 1116 sums the positive-input-signal VIP and the negative-input-signal VIM, in order to provide a summed-input-signal.

In this example, the integrator includes a halving-block 1118, which is an example of an attenuator that provides an attenuated-summed-input-signal.

The second-integrator-transconductance-amplifier 1114 receives the attenuated-summed-input-signal (or the summed-input-signal if a halving-block/attenuator is not used) and the common-mode-input-signal VCM. The second-integrator-transconductance-amplifier 1114 provides: (i) an output signal to the first-output adder 1130, and (ii) an output signal to the second-output adder 1132.

The first-output-adder 1130 provides the first-integrator-negative-first-output-signal IOM to the first-integrator-negative-first-output-terminal 1126. The second-output-adder 1132 provides the first-integrator-positive-first-output-signal IOP to the first-integrator-positive-first-output-terminal 1128.

A first-feedback-capacitor 1134 is connected between the first-integrator-negative-first-output-terminal 1126 and the first-integrator-positive-input-terminal 1120. A second-feedback-capacitor 1136 is connected between the first-integrator-positive-first-output-terminal 1128 and the first-integrator-negative-input-terminal 1124. In this way, an active-RC integrator can be provided.

The integrator can also include one or more positive-further-output-signal-generators (not shown), and one or more negative-further-output-signal-generators (not shown). The one or more positive-further-output-signal-generators can generate one or more first-integrator-positive-further-output-signals based on the first-integrator-positive-first-output-signal. The one or more negative-further-output-signal-generators can generate one or more first-integrator-negative-further-output-signals based on the first-integrator-negative-first-output-signal. Such signal generators can be implemented as current mirrors, as will be described below.

The one or more positive-further-output-signal-generators can provide the one or more first-integrator-positive-further-output-signals to one or more first-integrator-positive-further-output-terminals. The one or more negative-further-output-signal-generators can provide the one or more first-integrator-negative-further-output-signals to one or more first-integrator-negative-further-output-terminals.

That is, the integrator can also include the following output-terminals (not shown) for providing replicas of the output-signals.

one or more first-integrator-positive-further-output-terminals, each configured to provide a first-integrator-positive-further-output-signal; and one or more first-integrator-negative-further-output-terminals, each configured to provide a first-integrator-negative-further-output-signal.

In the example of FIG. 11B, the transconductance of the first-integrator-transconductance-amplifier 1112 can be unequal to the transconductance of the second-integrator-transconductance-amplifier 1114. This additional degree of freedom can be advantageously exploited.

Figure 12:
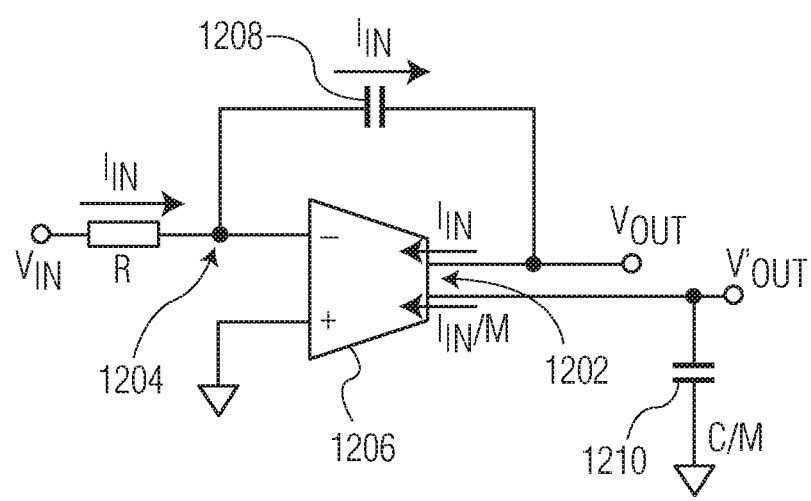
FIG. 12 shows an active-RC integrator, with a replica output terminal.

FIG. 12 shows an active-RC integrator, with a replica output terminal 1202. At the inverting input of the transconductor 1206, a virtual-ground node 1204 is created by the feedback loop around the transconductor 1206. The input voltage VIN is therefore converted linearly into an input current IIN. Since the current IIN cannot flow into the inverting input of the transconductor 1206, the feedback loop forces the output voltage VOUT such that the IIN flows through the feedback capacitor C 1208. Therefore, VOUT is proportional to the integral of IIN, which is what is expected of an integrator. Furthermore, if the integrator is not (significantly) loaded, then the output current of the transconductor 1206 is almost identical to the input current IIN. The transconductor 1206 can provide another output signal that is a replica of the output current at the replica output terminal 1202, for example using a current mirror. When this replica current is fed to a replica-output-capacitor 1210, a replica V'OUT of the output voltage VOUT is provided.

In this example, the transconductor 1206 provides the replica of the output current that is scaled down by a factor of M. This scaled down replica current (IIN/M) is fed to the replica-output-capacitor 1210 that is M-times smaller than the feedback capacitor 1208 to create the same replica output voltage V'OUT, but with reduced power and area overhead.

If the active-RC integrator of FIG. 12 is used as a first-integrator in a $2^{nd}$ order (or higher) PWM feedback loop, and the further-integrators are provided as Gm-C integrators, then advantageously the replica-output-capacitor 1210 that is connected to the replica output terminal 1202 can be combined with the output capacitor of the subsequent Gm-C integrators, as will be described below with reference to FIG. 13. Therefore, by combining a quasi-differential first integrator stage with Gm-C subsequent integrator stages, a high order quasi-differential loop filter can be realized.

FIG. 13 shows an example embodiment of an amplifier-circuit 1300 that comprises a class-D amplifier with a quasi-differential 3rd order loop filter. FIG. 13 shows a BTL configuration of the class-D amplifier, which consists of two similar bridge-halves.

The amplifier-circuit 1300 has amplifier-circuit-input-terminals 1302, 1303, which receive input-signals. In this example the input-signals are signals that are received from a transconductance amplifier 1304, which receives an input voltage VIN. One of the bridge-halves receives a positive-input-signal, and the other bridge-half receives a negative-input-signal. The amplifier-circuit 1300 also has two amplifier-circuit-output-terminals 1306, 1307 that provide output-signals, which in this embodiment are PWM-output-signals VOUTA, VOUTB.

For clarity, only one of the bridge-halves will be described in detail below.

The amplifier-circuit 1300 includes a loop-filter 1308, a PWM-module 1310 and a feedback path 1312. In this example, the feedback path 1312 includes a feedback-resistor 1314. The loop-filter 1308 has a loop-filter-output-terminal 1316 that provides a loop-filter-output-signal VIA to the PWM-module 1310. The PWM-module 1310 provides the PWM-output-signal VOUTA. In this way, the high level structure of one of the bridge-halves of the amplifier-circuit 1300 corresponds to the structure that is illustrated above with reference to FIG. 5.

The loop-filter 1308 has a first-integrator 1318 and one or more further-integrators, in this example two further integrators 1320, 1322. The first-integrator 1318 is an active-RC integrator. The further-integrators 1320, 1322 are Gm-C integrators, which can be advantageous because they provide a convenient way of summing the feedforward currents from the first-integrator, in that the summing may not require additional power consumption or significant extra area.

The first-integrator 1318 has a first-integrator-input-terminal 1324 that receives: (i) the input-signal from the input-terminal 1302, and (ii) a feedback-signal, which is representative of the PWM-output-signal VOUTA, from the feedback-path 1312. As discussed above, the presence of a virtual ground node at the first-integrator-input-terminal 1324 advantageously enables the input-signal and the feedback-signal to be accurately added together without requiring any additional components. This can therefore contribute to the amplifier-circuit having a low power consumption and/or occupying a small area. Also, use of a virtual ground node can be considered beneficial when compared with an alternative of using a high-bandwidth, high-linearity V-to-I converter, which would be impractical in some applications.

The first-integrator 1318 also has a first-integrator-first-output-terminal 1326 and two first-integrator-further-output-terminals 1328. The first-integrator-first-output-terminal 1326 provides a first-integrator-first-output-signal, which is proportional to an integral of the signals received at the first-integrator-input-terminal 1324. The first-integrator-further-output-terminals 1328, are each configured to provide a first-integrator-further-output-signal that is proportional to an integral of the signals received at the first-integrator-input-terminal. The first-integrator-further-output-signals can be considered as replicas of the first-integrator-first-output-signal. Optionally, as discussed above with reference to FIG. 12, the first-integrator-further-output-signals can be scaled-down versions of the first-integrator-first-output-signal.

The two further-integrators 1320, 1322 are connected in series between the first-integrator-first-output-terminal 1326 and the loop-filter-output-terminal 1316. Each of the further-integrators 1320, 1322 has a further-integrator-output-terminal 1330, 1332 and a further-integrator-input-terminal 1334, 1336. Each further-integrator-output-terminal 1330, 1332 provides a further-integrator-output-signal that is proportional to an integral of the signals received at its further-integrator-input-terminal 1334, 1336.

For the first further-integrator 1330 in the series, the further-integrator-input-terminal 1334 receives the first-integrator-first-output-signal from the first-integrator-first-output-terminal 1326. For the second further-integrator 1322, and optionally also any subsequent further-integrators in the series (not shown), the further-integrator-input-terminal 1326 is configured to receive: (i) the further-integrator-output-signal from the further-integrator-output-terminal 1330 of the preceding further-integrator 1320 in the series; and optionally (ii) one of the first-integrator-further-output-signals from one of the first-integrator-further-output-terminals 1328. It will be appreciated that the specific connections between the integrators can be set so as to apply a transfer function that is required of the loop-filter 1308.

In this example, one of the first-integrator-further-output-terminals 1328 is connected to the loop-filter-output-terminal 1316 such that a first-integrator-further-output-signal is provided to the loop-filter-output-terminal 1328. It will be appreciated that in other examples, depending upon the transfer function that is required of the loop-filter 1308, one of the first-integrator-further-output-terminals 1328 need not necessarily be connected to the loop-filter-output-terminal 1316.

It will also be appreciated that the loop-filter 308 can easily be scaled up to a higher order by adding more gm-C further-integrator stages in series, and optionally also with additional first-integrator-further-output-terminals 1328 for providing additional replica output signals from the first-integrator 1318. Also, the loop-filter 308 can be extended with gm-C resonator sections.

The position of the zeros in the transfer function that is implemented by the loop-filter 1308 can be tuned by proper scaling of the gm-C transconductors of the further-integrators 1320, 1322.

The PWM-modulator 1310 receives the loop-filter-output-signal VIA from the loop-filter-output-terminal 1316, and also receives a reference-signal VREF 1338. As discussed above in relation to FIGS. 2 and 3 (amongst others), the PWM-modulator 1310 includes a comparator 1340 that compares the loop-filter-output-signal VIA with the reference-signal VREF 1338 to provide a comparator-output-signal, and an output stage 1342 that is driven by the comparator-output-signal to provide the PWM-output-signal VOUTA. In this way, the PWM-modulator 1310 can provide the PWM-output-signal VOUTA based on a comparison between the loop-filter-output-signal VIA and the reference-signal VREF 1338.

In this example, the first-integrator stage 1318 uses the quasi-differential architecture of FIG. 11B with four (scaled) replica output signals that are fed forward to the gm-C further-integrator stages 1320, 1322 in each bridge-half. The summation of the feedforward currents is essentially passive and therefore advantageously may not require additional power.

By reducing the common-mode transconductance of the quasi-differential first-integrator stage 1318, the common-mode transfer function of the class-D amplifier becomes less accurate. This can save power and/or area, yet in first order may advantageously not significantly affect the differential-mode transfer function.

Figure 14:
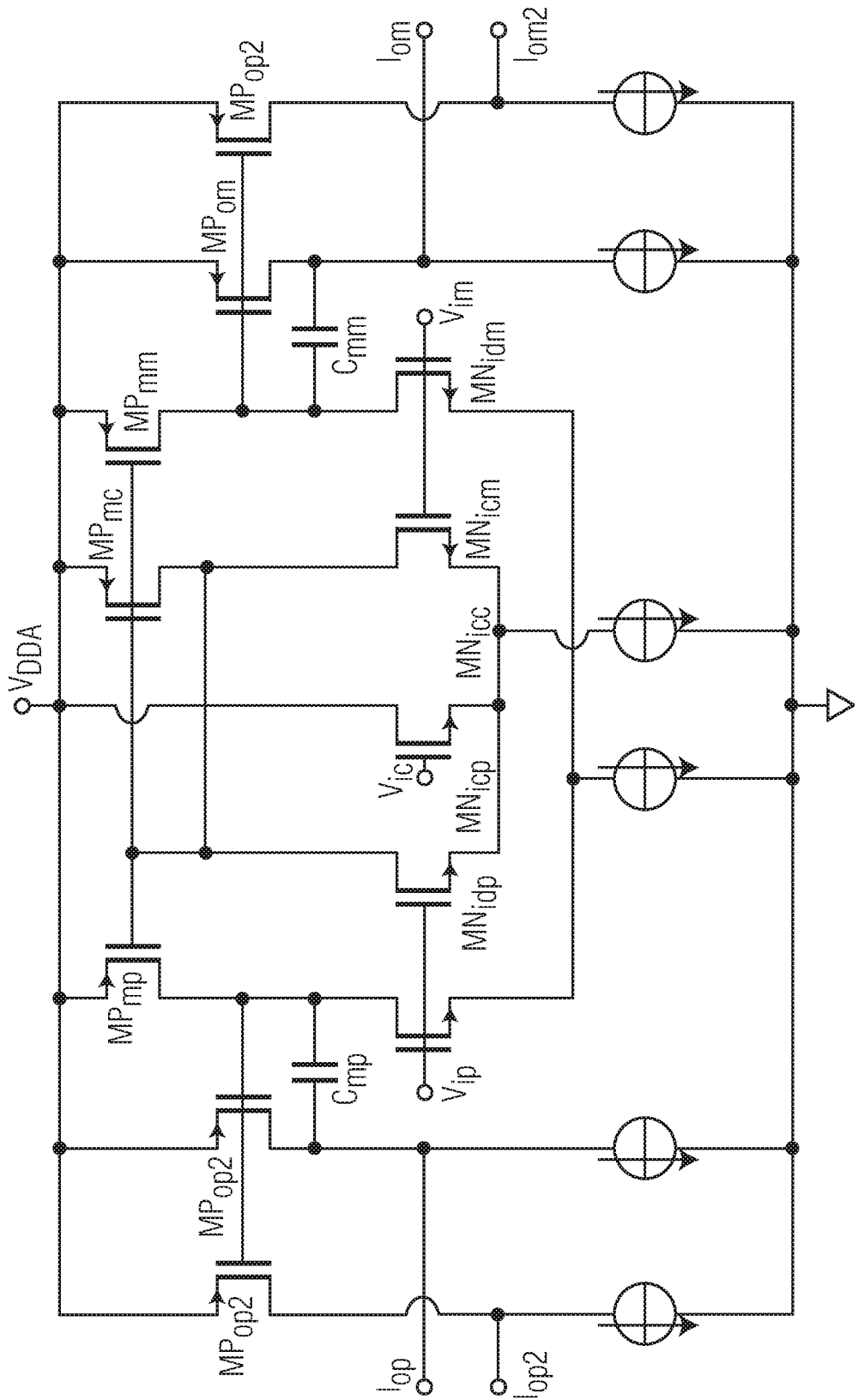
FIG. 14 shows an example transistor implementation of a quasi-differential operational transconductance amplifier (OTA) with replica outputs, which can be used as the first-integrator of FIG. 13.

FIG. 14 shows an example transistor implementation of a quasi-differential operational transconductance amplifier (OTA) with replica outputs, which can be used as the first-integrator of FIG. 13.

The topology of FIG. 14 is based on the classic two-stage Miller compensated OTA. The quasi-differential transconductance configuration of FIG. 11B is implemented in the first stage. The differential mode path goes through differential pair $MN_{idp/idm}$. The common-mode path goes through three-input differential pair $MN_{icp/icm/icc}$. The summation of $V_{ip}$ and $V_{im}$ is implemented by connecting the drains of $MN_{icp}$ and $MN_{icm}$ together. In this way $MN_{icp}$ and $M_{icm}$ act as a single transistor in a two-input differential pair that has the common mode of $V_{ip}$ and $V_{im}$ as gate input. The other half of the differential pair is $MN_{ioc}$, which has the common-mode reference level as input. The output of this common-mode differential pair is mirrored through $MP_{mp/mc/mm}$ and added to the output of the differential-mode differential pair. The second stage is realized by two single-ended common-source stages $MP_{op/om}$ with Miller-compensation capacitors $C_{mp/mm}$. The "main" output terminals of the OTA are labelled as $I_{om}$ and $I_{op}$, which correspond to the first-integrator-first-output-terminals of FIG. 13.

Also shown in FIG. 14 is a pair of first-integrator-further-output-terminals, labelled as $I_{om2}$ and $I_{op2}$, for providing replica output signals. As discussed above with reference to FIG. 13, the replica output signals can be used as feedforward currents to subsequent/further $g_m$-C integrator stages. As shown in FIG. 14, these replica output signals can be made easily by connecting replica output transistors $MP_{op2/om2}$. By scaling these replica output transistors $MP_{op2/om2}$, the replica output current is also scaled. In this way, a higher-order loop filter can be realized with relatively low area and power overhead.

Figure 15:
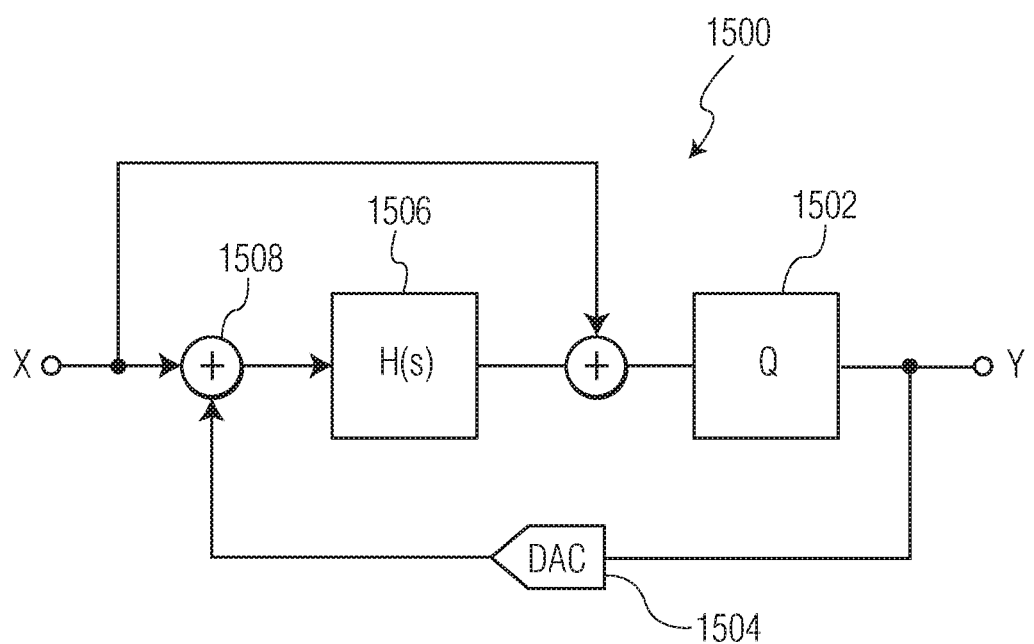
FIG. 15 shows a high-level block diagram of a continuous time sigma-delta converter that can use a loop-filter that is described herein.

FIG. 15 shows a high-level block diagram of a continuous time sigma-delta converter (CT-ΣΔ modulator) 1500. The CT-ΣΔ modulator 1500 receives an input-signal X. The final stage of the CT-ΣΔ modulator 1500 is a quantizer 1502 (which is an example of a modulator) that provides a digital output-signal Y.

The CT-ΣΔ modulator 1500 includes a loop-filter 1506, which applies a transfer function H(s) to a combination of the input-signal X and the PWM-output-signal Y in order to set the loop gain of the modulator 1500.

The output signal from the loop filter 1506 is quantized by the quantizer 1502 in order to generate the output-signal Y. The output-signal Y is fed back to an input-summation block 1508, which adds the output-signal Y to the input-signal X in order to provide the input signalling to the loop-filter 1506.

Conceptually, the main difference between the CT-ΣΔ modulator 1500 and the class-D amplifier of FIG. 5 is that the final stage of a class-D amplifier is a PWM modulator with an analogue output signal, whereas the final stage of the CT-ΣΔ modulator 1500 is a quantizer 1502 with a digital output signal. Since the output-signal Y is a digital signal in the CT-ΣΔ modulator 1500, a digital-to-analogue converter (DAC) 1504 is used in the feedback path. Also shown in FIG. 15 is an optional direct feedforward path from the input to the quantizer 1502. This direct feedforward path can be used to relax the requirements for the loop filter H(s) 1506.

The CT-ΣΔ modulator 1500 can include any loop-filter 1506 described herein, including the loop-filter of FIG. 13. In this way, the CT-ΣΔ modulator 1500 can benefit from the same advantages as the audio-amplifier-circuit of FIG. 13.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A circuit comprising:
    a loop-filter comprising:
        a loop-filter-output-terminal configured to provide a loop-filter-output-signal;
        a first-integrator, wherein the first-integrator is an active-RC integrator, the first-integrator comprising:
            a first-integrator-input-terminal configured to receive: (i) an input-signal, and (ii) a feedback-signal;
            a first-integrator-first-output-terminal configured to provide a first-integrator-first-output-signal, which is proportional to an integral of the signals received at the first-integrator-input-terminal; and
            one or more first-integrator-further-output-terminals, which are each configured to provide a first-integrator-further-output-signal that is proportional to an integral of the signals received at the first-integrator-input-terminal;
        one or more further-integrators, wherein:
            each of the one or more further-integrators is a Gm-C integrator,
            the one or more further-integrators are connected in series between the first-integrator-first-output-terminal and the loop-filter-output-terminal,
            each of the further-integrators comprises a further-integrator-output-terminal and a further-integrator-input-terminal;
            each further-integrator-output-terminal is configured to provide a further-integrator-output-signal that is proportional to an integral of the signals received at its further-integrator-input-terminal;
            for a first further-integrator in the series, the further-integrator-input-terminal is configured to receive the first-integrator-first-output-signal; and
            for any subsequent further-integrators in the series, the further-integrator-input-terminal is configured to receive: (i) the further-integrator-output-signal from the preceding further-integrator in the series; and (ii) one of the first-integrator-further-output-signals.

2. The circuit of claim 1 wherein the first-integrator comprises a quasi-differential architecture.

3. The circuit of claim 1, further comprising:
    a circuit-input-terminal configured to receive the input-signal;
    a circuit-output-terminal configured to provide an output-signal, wherein the feedback-signal is representative of the output-signal; and
    a modulator configured to provide the output-signal based on the loop-filter-output-signal.

4. The circuit of claim 1, wherein the first-integrator of the loop-filter comprises:
    a first-integrator-positive-input-terminal configured to receive a positive-input-signal;
    a first-integrator-negative-input-terminal configured to receive a negative-input-signal;
    a first-integrator-common-mode-input-terminal configured to receive a common-mode-input-signal;
    a first-integrator-positive-first-output-terminal configured to provide a first-integrator-positive-first-output-signal;
    one or more first-integrator-positive-further-output-terminals, each configured to provide a first-integrator-positive-further-output-signal;
    a first-integrator-negative-first-output-terminal configured to provide a first-integrator-negative-first-output-signal;
    one or more first-integrator-negative-further-output-terminals, each configured to provide a first-integrator-negative-further-output-signal;
    a first-integrator-transconductance-amplifier;
    a second-integrator-transconductance-amplifier;
    an input-adder;
    a first-output-adder;
    a second-output-adder;
    one or more positive-further-output-signal-generators;
    one or more negative-further-output-signal-generators;
    wherein:
        the first-integrator-transconductance-amplifier is configured to receive the positive-input-signal and the negative-input-signal, and provide: (i) an output signal to the first-output adder, and (ii) an output signal to the second-output adder;
        the input-adder is configured to sum the positive-input-signal and the negative-input-signal, and provide a summed-input-signal;
        the second-integrator-transconductance-amplifier is configured to receive the summed-input-signal and the common-mode-input-signal, and provide: (i) an output signal to the first-output adder, and (ii) an output signal to the second-output adder;
        the first-output-adder is configured to provide the first-integrator-negative-first-output-signal to the first-integrator-negative-first-output-terminal;

the second-output-adder is configured to provide the first-integrator-positive-first-output-signal to the first-integrator-positive-first-output-terminal;

the one or more positive-further-output-signal-generators are configured to:
  generate the one or more first-integrator-positive-further-output-signals based on the first-integrator-positive-first-output-signal; and
  provide the one or more first-integrator-positive-further-output-signals to the one or more first-integrator-positive-further-output-terminals;

the one or more negative-further-output-signal-generators are configured to:
  generate the one or more first-integrator-negative-further-output-signals based on the first-integrator-negative-first-output-signal; and
  provide the one or more first-integrator-negative-further-output-signals to the one or more first-integrator-negative-further-output-terminals.

5. The circuit of claim 4, wherein the transconductance of the first-integrator-transconductance-amplifier is unequal to the transconductance of the second-integrator-transconductance-amplifier.

6. The circuit of claim 4, wherein the first-integrator of the loop-filter further comprises an attenuator configured to provide an attenuated-summed-input-signal, and wherein:
  the second-integrator-transconductance-amplifier is configured to receive the attenuated-summed-input-signal and the common-mode-input-signal.

7. The circuit of claim 1, wherein the loop-filter comprises two or more further-integrators.

8. The circuit of claim 1, wherein one of the first-integrator-further-output-terminals is connected to the loop-filter-output-terminal in order to provide a first-integrator-further-output-signal to the loop-filter-output-terminal.

9. The circuit of claim 1, wherein one or more of the first-integrator-further-output-signals represents a scaled-down version of the first-integrator-first-output-signal.

10. The circuit of claim 1, wherein the first integrator comprises a current mirror configured to provide the one or more first-integrator-further-output-signals.

11. The circuit of claim 1, wherein the circuit comprises an audio-amplifier-circuit.

12. The circuit of claim 3, wherein the modulator comprises a PWM-modulator configured to provide the output-signal based on a comparison between the loop-filter-output-signal and a reference-signal.

13. The circuit of claim 3, wherein:
  the circuit comprises a sigma-delta-modulator-circuit; and
  the modulator comprises a quantizer configured to provide the output-signal by quantizing the loop-filter-output-signal.

14. A bridge-tied-load circuit comprising:
  a positive-audio-amplifier-circuit comprising the circuit of claim 3, wherein:
    the circuit-input-terminal is a positive-circuit-input-terminal that is configured to receive a positive-input-signal; and
    the circuit-output-terminal is a positive-circuit-output-terminal configured to provide a positive-PWM-output-signal; and
  a negative-audio-amplifier-circuit comprising the circuit of claim 3, wherein:
    the circuit-input-terminal is a negative-circuit-input-terminal that is configured to receive a negative-input-signal; and
    the circuit-output-terminal is a negative-circuit-output-terminal configured to provide a negative-PWM-output-signal.

15. The bridge-tied-load circuit of claim 14, further comprising a quasi-differential integrator configured to provide the functionality of the first-integrator of both the positive-audio-amplifier-circuit and the negative-audio-amplifier-circuit.

* * * * *